(12) United States Patent
Gornstein et al.

(10) Patent No.: US 7,689,637 B1
(45) Date of Patent: Mar. 30, 2010

(54) ADAPTIVE FILTERING METHOD AND RELATED DEVICE

(75) Inventors: Viktor L. Gornstein, New York, NY (US); Gennady Turkenich, Hillsdale, NJ (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/564,427

(22) Filed: May 4, 2000

(51) Int. Cl.
*G06F 17/10* (2006.01)
(52) U.S. Cl. ...................................... 708/322
(58) Field of Classification Search ......... 708/300–323; 333/166; 375/232
See application file for complete search history.

(56) References Cited

U.S. PATENT DOCUMENTS

| | | | |
|---|---|---|---|
| 4,791,390 A | 12/1988 | Harris et al. | |
| 4,989,170 A * | 1/1991 | Batruni et al. | 708/322 |
| 5,414,767 A | 5/1995 | Kerguiduff | |
| 5,535,149 A * | 7/1996 | Mori et al. | 708/322 |
| 5,568,411 A * | 10/1996 | Batruni | 708/322 |
| 5,586,068 A * | 12/1996 | Rakib | 708/319 |
| 5,638,311 A | 6/1997 | Fujii et al. | |
| 5,781,463 A * | 7/1998 | Ogawa et al. | 708/322 |
| 5,805,481 A * | 9/1998 | Raghunath | 708/322 |
| 5,901,175 A * | 5/1999 | Limberg | 708/322 |
| 5,951,626 A | 9/1999 | Duttweiler | |
| 6,118,814 A | 9/2000 | Friedman | |
| 6,337,878 B1 * | 1/2002 | Endres et al. | 708/322 |
| 6,396,548 B1 * | 5/2002 | Gornstein et al. | 708/322 |

OTHER PUBLICATIONS

Allen Gersho, Adaptive Filtering with Binary Reinforcement, 1984, IEEE Transactions on Information Theory, vol. IT-30, No. 2, p. 191-199.*

* cited by examiner

*Primary Examiner*—Chat C Do

(57) ABSTRACT

An input signal is filtered for creating an output signal using an adaptive filter. An error signal is derived from the output signal. The adaptive filter has coefficient whose value can be modified. A value of a coefficient is modified using a derived updating amount. The updating amount is obtained from the product of a value of the input signal, a value of the polarity of the error signal, and a step gain. The step gain has the form $2^K$ with K being an integer and being dependent on a magnitude of the value of the error signal and on a step gain parameter. The updating amount is dependent on both the magnitude and the polarity of the error signal, therefore allowing a precise update of the coefficient. The specific form of the step gain allows a fast derivation of the product.

10 Claims, 4 Drawing Sheets

$$Sout(n) = \sum_{k=0}^{m-1} Sin(n-k).Ck(n)$$

FIG.1A (PRIOR ART)

$E(n) = Sref(n) - Sout(n)$

FIG.1B (PRIOR ART)

$Cj(n+1) = Cj(n) + g(n).f1(E(n)).f2(Sin(n-j))$

FIG.1C (PRIOR ART)

$Cj(n+1) = Cj(n) + \mu.E(n).Sin(n-j)$

FIG.1D (PRIOR ART)

$E(n) = Sref(n-i) - Sout(n-i)$

FIG.1E $E(n) = G1(Sref^2(n-i) - Sout^2(n-i)).G2(Sref(n-i) - Sout(n-i))$

FIG.1F $Cj(n+1) = Cj(n) + DCj(n)$

FIG.1G $Cj(n+1) = Cj(n) + 2^K.SGN(n).Sin(n-j-i)$

FIG.1H $Cj(n+1) = Cj(n) + 2^{(K1+K2)}.SGN(n).Sin(n-j-2)$

FIG.1I $Sout(n) = Sin(n).C0(n) + Sin(n-1).C1(n)$
$\qquad + Sin(n-2).C2(n) + Sin(n-3).C3(n)$

FIG.1J $C1(n+1) = C1(n) + 2^{(K1+K2)}.SGN(n).Sin(n-1-2)$

FIG.1K

ADAPTIVE FILTERING METHOD AND RELATED DEVICE

FIELD OF THE INVENTION

The invention relates to a method of processing an input signal. It also relates to a corresponding data processing device for carrying out such a method.

The invention is particularly relevant to the processing of video or audio data that are subjected to distortion during transmission over a communication channel.

BACKGROUND ART

In the following paragraphs, when a reference "A" designates a signal A, "A(n)" designates the digitized value of the signal A at a discrete time n.

The input signal Sin may represent any type of digital video, audio or communication data. The signal Sin represents, for example, video or audio data. The input signal Sin may be, for example, an intermediate frequency modulated by the compressed video data originated from a base station. It is transmitted from a base station to a receiver over terrestrial broadcast, cable or satellite channel. During transmission, the signal Sin may have been subjected to various forms of distortions. The transmitted input signal Sin may comprise a training sequence. The received training sequence may be corrupted. In order to compensate for certain types of distortions, the possibly corrupted input signal Sin is filtered using an adaptive filter F. The filter F is adapted so that the received training sequence after filtering approximates the original training sequence that is known in advance by the receiver. The filter F has a set C of m adjustable coefficients having values $C0(n), C1(n), \ldots, Cm-1(n)$ at discrete time n. The filter F creates an output signal Sout and the value Sout(n) is obtained from the values of the filter coefficients at time n and values. of the input signal Sin buffered in the filter F at time n as shown in the equation of FIG. 1A.

To adapt the filter F, an error signal E is derived as a difference between a reference signal Sref and the signal Sout as shown in Equation of FIG. 1B. The reference signal is the training sequence known in advance by the receiver. This method of adaptive filtering or equalization relies on the training sequence to adapt the coefficients, and is often called a "trained equalization".

An adaptation of the coefficients may also be performed by a so-called blind equalization. A blind equalization does not require transmission of a training sequence. The derivation of the error signal E and the adaptation of the coefficients rely on statistical properties of the adaptive filter's output signal Sout.

A possible adaptation method consists of updating the set C so as to minimize the error signal E. Updating the set C is usually carried out by a method which updates each coefficient as the time increments from time n to time n+1. A form of an update equation for a coefficient Cj at time n is given by FIG. 1C where g is a mathematical scalar function of the time n, f1 is a mathematical scalar function of the value of the error signal at time n, and f2 is a mathematical scalar function of the value of the input signal Sin(n-j that is, at time n, buffered in the filter F and associated with the coefficient Cj A well-known adaptation equation having a form shown in FIG. 1D relates to the Least Mean Square (LMS) algorithm, which is intended to adjust a coefficient of the filter F so as to minimize a discrepancy between the output signal of the filter F and a reference signal. The coefficient Cj(n) is updated using an adaptation step parameter µ that controls the rate of convergence of the algorithm.

The U.S. Pat. No. 5,568,411, herein incorporated by reference, discloses a method of updating the coefficients of an adaptive filter. The method closely resembles the well-known LMS update algorithm. The known method addresses a coefficient update relationship based on a polarity-coincidence correlator that is based on a sum of products of the sign of the error signal and the signs of consecutive N time samples of the input signal.

SUMMARY OF THE INVENTION

It is an object of the invention to provide an efficient method of filtering that can be easily implemented in a data processing device. Other objects of the invention are providing a data processing device capable of high-speed data processing and providing a low-cost implementation for such a device.

To this end, the invention provides a method of processing an input signal. The method comprises the following steps. The input signal is filtered for creating an output signal using a filter having adjustable filter coefficients. An error signal is derived from the output signal. For at least a specific one of the filter coefficients, an updating amount is created from a product of a first value of the input signal, a second value of a binary signal dependent on a polarity of a third value of the error signal, and a fourth value of a step gain. The step gain has the form $2^K$ with K being an integer and being dependent on a magnitude of the third value and on a step gain parameter. The specific filter coefficient is then adjusted using the updating amount thus derived.

A method of processing of the invention aims at obtaining an output signal that minimizes the error signal by means of adaptation of at least a specific one of the coefficients. The adaptation of a coefficient is performed on the basis of a value of the input signal, the polarity of the error signal and a given step gain of the form $2^K$, the integer K being a function of the magnitude of a value of the error signal. Compared to a known method of signal processing using filtering with an update of coefficients based on a theoretical LMS equation, the method of the invention is less complicated since fewer multiplications are needed. Besides, in comparison with a method of filtering as disclosed in the background art section, the method of the invention involves not only the polarity of the error signal but also the magnitude of the error signal. Therefore, the method of the invention allows a more precise adaptation of the filter coefficients. Besides, the step gain involved is of the form $2^K$, which is easily implemented by means of, for example, a barrel shifter or a look-up-table prepared in advance. Thus, an advantage of a method of the invention is that the method is a fast and efficient update mechanism for the filter coefficients avoiding multiple multiplications. A method of the invention is a good compromise between the accuracy of a method based on a theoretical algorithm and low-computational method described in the background art section.

The invention also relates to a data processing device for processing a digital input signal. The device of the invention comprises a filtering circuit having adjustable filter coefficients for filtering the input signal and creating an output signal. The device further has an error calculator for deriving an error signal from the output signal. The device also comprises a step gain calculator for deriving a first value of a step gain of a form $2^K$, wherein K is an integer based on a magnitude of a second value of the error signal and on a step gain parameter. The device also has a sign unit for providing a binary signal dependent on a polarity of the second value of the error signal, and an updating circuit. The updating circuit derives, for at least a specific one of the filter coefficients, an updating amount and adjusts the specific coefficient using the updating amount. The updating amount is formed from a product of a third value of the input signal, the first value and a fourth value of the binary signal.

A device of the invention performs simple multiplications. Generally, multiplications are costly in terms of processing resources, so a device of the invention makes efficient use of the processing resources and compute time available.

BRIEF DESCRIPTION OF THE DRAWINGS

The invention is explained in further detail, by way of example, and with reference to the accompanying drawing wherein:

FIGS. 1A-1K are mathematical equations;

Elements within the drawing having similar or corresponding features are identified by like reference numerals.

DETAILED DESCRIPTION OF THE PREFERRED EMBODIMENT

Figure 2:
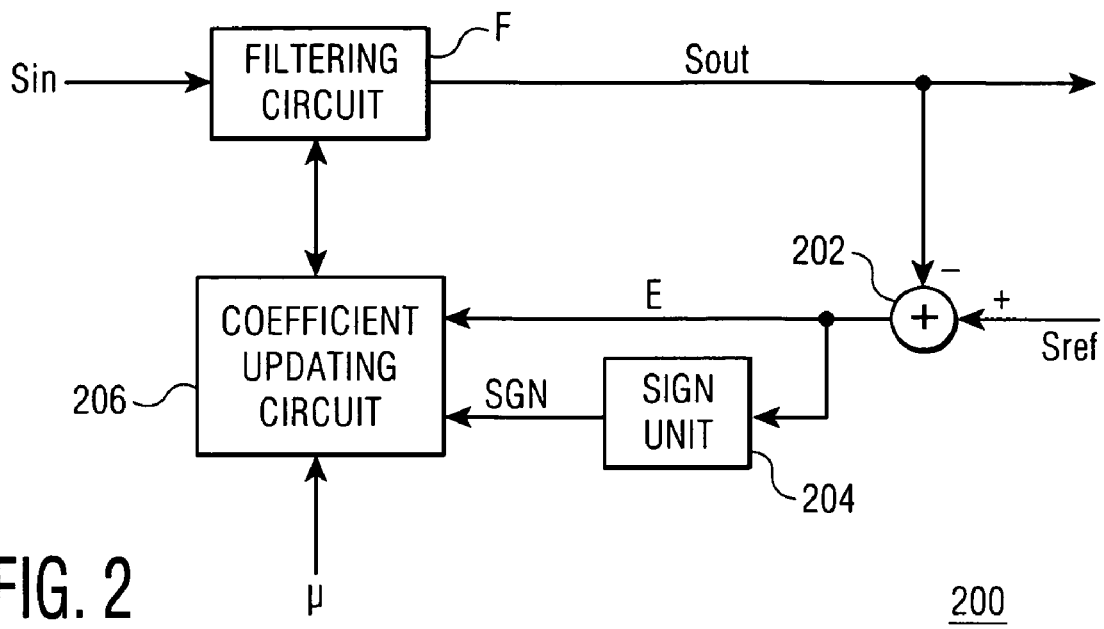
FIG. 2 is a block diagram of a data processing device in accordance with the invention.

FIG. 2 is a block diagram of an embodiment of a data processing device 200 according to the invention. The device 200 comprises a filtering circuit F for filtering a digital input signal Sin for creating a digital output signal Sout. The filtering circuit F has a set C of m adjustable filtering coefficients having the values $C0(n), C1(n) \ldots, Cm-1(n)$ at a discrete time n. The coefficients are said to be adjustable with the meaning that their values can be modified. For example, as shown in the following examples, the coefficients can be adaptive coefficients and therefore the filter F is an adaptive filter.

The device 200 may be part of a receiver that receives the input signal Sin transmitted by an emitter over a communication channel. The device 200 performs equalization of the signal Sin. In a trained equalization, transmission of the input signal Sin, on the emitter side, comprises transmission of a reference signal Sref as a part of the input signal Sin. On the receiver side, a distorted version of the signal Sref is received. This signal Sref is often referred to as a training sequence. The distorted version of the reference signal Sref is filtered by the filter F and results in a filtered distorted version of the reference signal Sref. The filtered distorted version of the reference signal Sref is a part of the output signal Sout. One skilled in the art can partly remove channel distortions by deriving an error signal E from the signal Sref and the filtered distorted version of the reference signal Sref, by minimizing the error signal and by using that result to create the output signal Sout. In a blind equalization, transmission of the input signal Sin does not include transmission of the reference signal Sref. In that case, the error signal E is derived from statistical properties of the output signal Sout.

In this embodiment, a trained equalization is performed. The device 200 further comprises an error calculator 202 for deriving the error signal E from the output signal Sout and from the reference signal Sref. The reference signal Sref is known a priori by the device 200.

In this embodiment, the calculator 202 has a comparator that calculates the difference between the reference signal Sref and the output signal Sout, as shown in FIG. 1E. The quantity i is a positive integer that represents a delay required by the calculator 202 to perform the calculation of the error signal E. Thus, the value E(n) of the error signal currently available at the output of the calculator 202, at a discrete time n, is the error value associated with the value of the output signal Sout and the value of the reference signal Sref, both at time n-i. In an ideal embodiment of the invention, this delay i may effectively be zero and the value E(n) of the error signal at time n is associated with the current values Sout(n) and Sref(n) at time n. The calculation of the error signal E given in FIG. 1E is by no means a limitation of the invention and one skilled in the art could derive any suitable mathematical correspondence for representing a measure of the discrepancy between the initially transmitted and received versions of the reference signal Sref. In another embodiment of the invention, the error signal E may be derived following an equation of FIG. 1F. Herein, the error signal E is the product of a first function G1 of the difference of the respective squared values of the output and reference signals and a second function G2 of the difference between the values of the output and reference signals.

The derived error signal E is then supplied to a sign unit 204 that provides a binary sign signal SGN representing the polarity of the error signal E. The value of the SGN at time n is 0 when the signal E at time n is positive or null. The value of the SGN at time n is 1 when the signal E at time n is negative. The signal E and the signal SGN are then provided to an updating circuit 206. The updating circuit 206 updates at least a specific one Cj of the filter coefficients from the value Cj(n) at time n to a new value Cj(n+1) at time n+1.

To this end, the circuit 206 derives a corresponding coefficient updating amount DCj(n) as the product of the value Sin(n-j-i) of the input signal Sin, the value SGN(n) obtained from the value E(n) and a step gain M of the form $2^K$ with K being a negative integer. The value of the input signal Sin(n-j-i) is associated with the coefficient Cj at the time n-i leading to the value E(n) at time n. The quantity K depends on both a magnitude of the value E(n) and a step gain parameter $\mu$. The integer K may be the sum of a negative integer quantity K1 and of a positive integer quantity K2. The quantity K1 is possibly the logarithm in base 2 of $\mu$, with $\mu$ being preferably of the form $2^t$ wherein t is a negative integer. The quantity K2 is obtained from the magnitude of the current value of the error signal E and preferably increases when the magnitude of the error signal increases. Thus, when updating a coefficient Cj, the updating amount DCj(n) is larger in magnitude when the magnitude of the error signal E(n) increases. Thus, the step gain M decreases when the magnitude of the error signal decreases. In an embodiment of the invention, K2 can be calculated, at time n, as the logarithm in base 2 of the magnitude of the error signal E rounded to the nearest integer value. K2 may be retrieved from a look-up table storing values of K2 for various magnitudes of the error signal E.

Possibly, the new value Cj(n+1) of the coefficient Cj is then obtained by adding the derived updating amount DCj(n) to the value Cj(n) shown in the updating equations of FIG. 1G and of FIG. 1H. In the embodiment of the invention of FIG. 2, the delay i in the derivation of the error signal E is, for example, 2 discrete time periods. Thus, the value E(n) of the error signal at time n corresponds to the value Sout(n−2) of the output signal and to the value Sref(n−2) of the reference signal Sref taken 2 discrete time units earlier. In this embodiment of the invention, the updating equation of FIG. 1H becomes the equation of FIG. 1I.

When updating the coefficient Cj at time n, the circuit 206 may provide the filter F with the corresponding amount DCj(n) so that the filter F internally updates the coefficient Cj from the value Cj(n) to the value Cj(n+1). In another embodiment, the circuit 206 may also retrieve said value Cj(n) from the filter F, modifies the value Cj(n) on the basis of the derived amount DCj(n) and then loads the new value Cj(n+1) into the filter F replacing the value Cj(n). In a method of the invention, the whole set C is not necessarily updated all at once when time increments from time n to n+1. When a given coefficient Cj is not updated the value Cj(n+1) at time n+1 is the value Cj(n) at time n.

Figure 3:
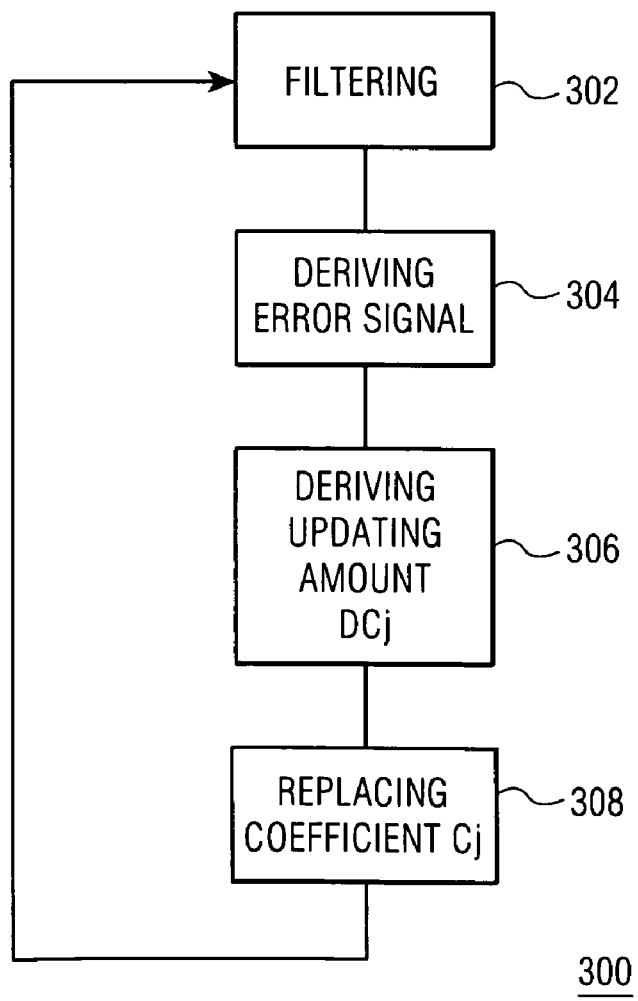
FIG. 3 is a flow diagram illustrating certain aspects of the invention.

FIG. 3 is a flow diagram 300 showing various steps of a method of filtering in the invention. A step 302 consists of filtering the input signal Sin for obtaining the output signal Sout using a filter having adjustable coefficients C0, ..., Cm-1 such as the filtering circuit F of FIG. 2. A step 304 consists of deriving the error signal E from the output signal Sout. In a trained equalization, the error signal E is derived from the output signal Sout and the reference signal Sref. In a blind equalization, the error signal E is derived from statistical properties of the output signal Sout. A next step 306 consists of deriving, for at least a specific one of the filter coefficient Cj, the updating amount DCj, associated with the specific filter coefficient Cj, as the product of a value of the input signal Sin, the sign of the error signal E and the step gain M of the form $2^{K1+K2}$. The quantity K2 is a function of the magnitude of a value of the error signal. Then, on the basis of the derived amount DCj, a step 308 consists of modifying the value Cj(n) of the coefficient Cj using the derived updating amount DCj(n).

Figure 4:
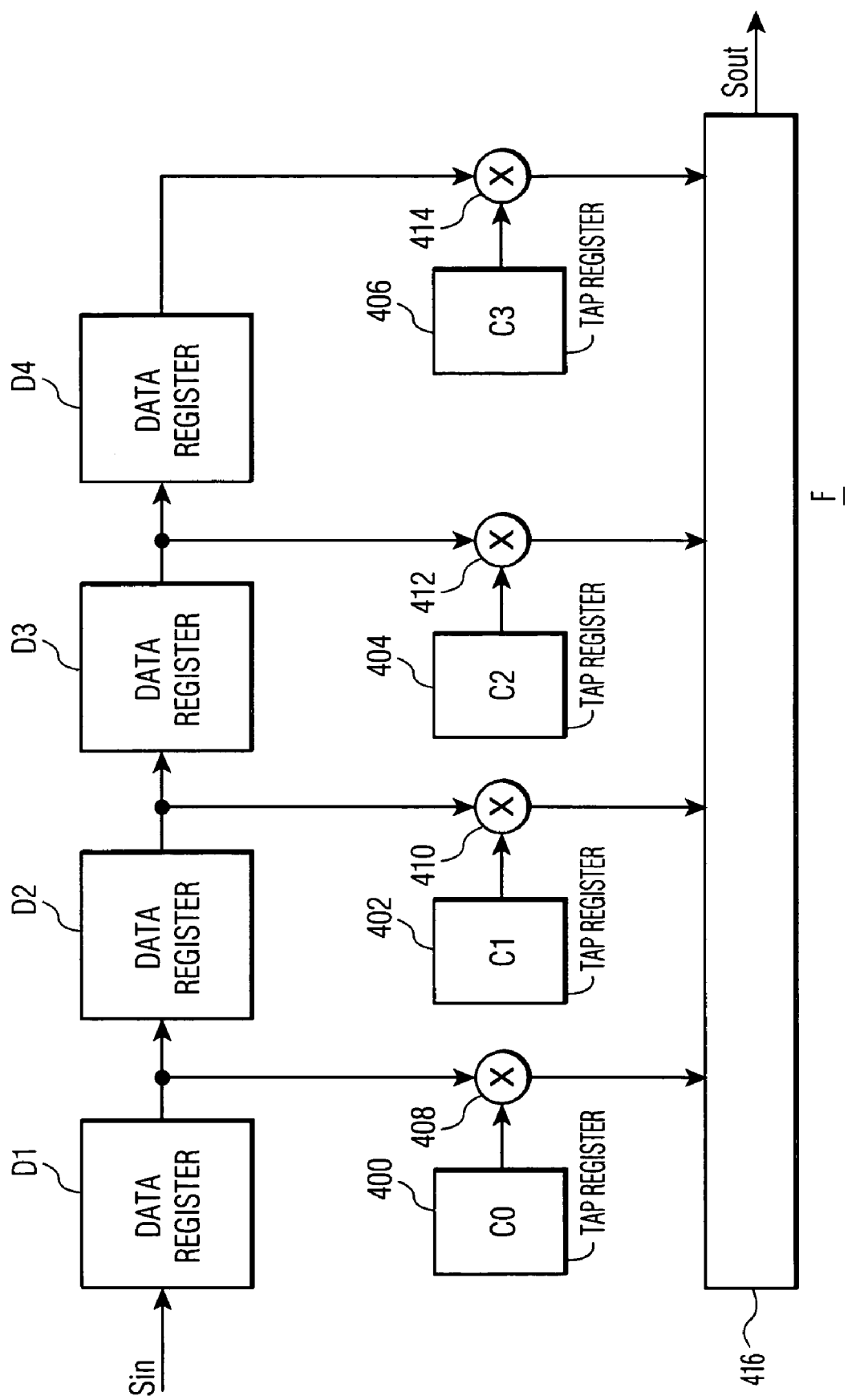
FIG. 4 is a block diagram of an adaptive filtering circuit in accordance with the invention.

The functioning of the filter F is now explained in details. A possible functional embodiment of the filter F is given in FIG. 4. The filter F is, for example, a four-tap filter, which means that the filtering circuit F has four coefficients C0, C1, C2 and C3, whose values C0(n), C1(n), C2(n) and C3(n) are stored at time n in four tap registers 400, 402, 404 and 406, respectively. The filtering circuit F also comprises four data registers D1, D2, D3, D4 for storing values of the input signal Sin. At time n, Sin(n), Sin(n−1) Sin(n−2) and Sin(n−3) are stored in the registers D1, D2, D3 and D4, respectively. The registers D1, D2, D3 and D4 form a FIFO ("first-in-first-out"). The filter F further comprises four multipliers 408, 410, 412 and 414.

At time n, the multiplier 408 receives the value Sin(n) of the input signal stored in the register D1 and the value C0(n) stored in the register 400. The multiplier 408 then provides an adder 416 with the product of the value Sin(n) and the value C0(n). At time n, the multiplier 410 receives the value Sin(n−1) stored in the register D2 and the value C1(n) stored in the register 402. The multiplier 410 then provides the adder 416 with the product of the value Sin(n−1) and the value C1(n). At time n, the multiplier 412 receives the value Sin(n−2) stored in the register D3 and the value C2(n) stored in the register 404. The multiplier 412 then provides the adder 416 with the product of the value Sin(n−2) and the value C2(n). Similarly, at time n, the multiplier 414 receives the value Sin(n−3) stored in the register D4 and the value C3(n) stored in the register 406. The multiplier 414 then provides the adder 416 with the product of the value Sin(n−3) and the value C3(n).

The adder 416, then, derives the value Sout(n) of the output signal at time n as the sum of the products as shown in the equation of FIG. 1J.

The values C0(n), C1(n), C2(n), C3(n) of the coefficients at time n may be adjusted by loading new values C0(n+1), C1(n+1), C2(n+1), C3(n+1) into the registers 400, 402, 404 and 406, respectively when time increments from time n to time n+1. The set C is not necessarily updated in its entirety when the time increments from time n to time n+1 and a single coefficient C1 may be updated following an equation of FIG. K, where SGN(E(n)) is the polarity of the value of E(n)=Sout(n−2)−Sref(n−2).

Figure 5:
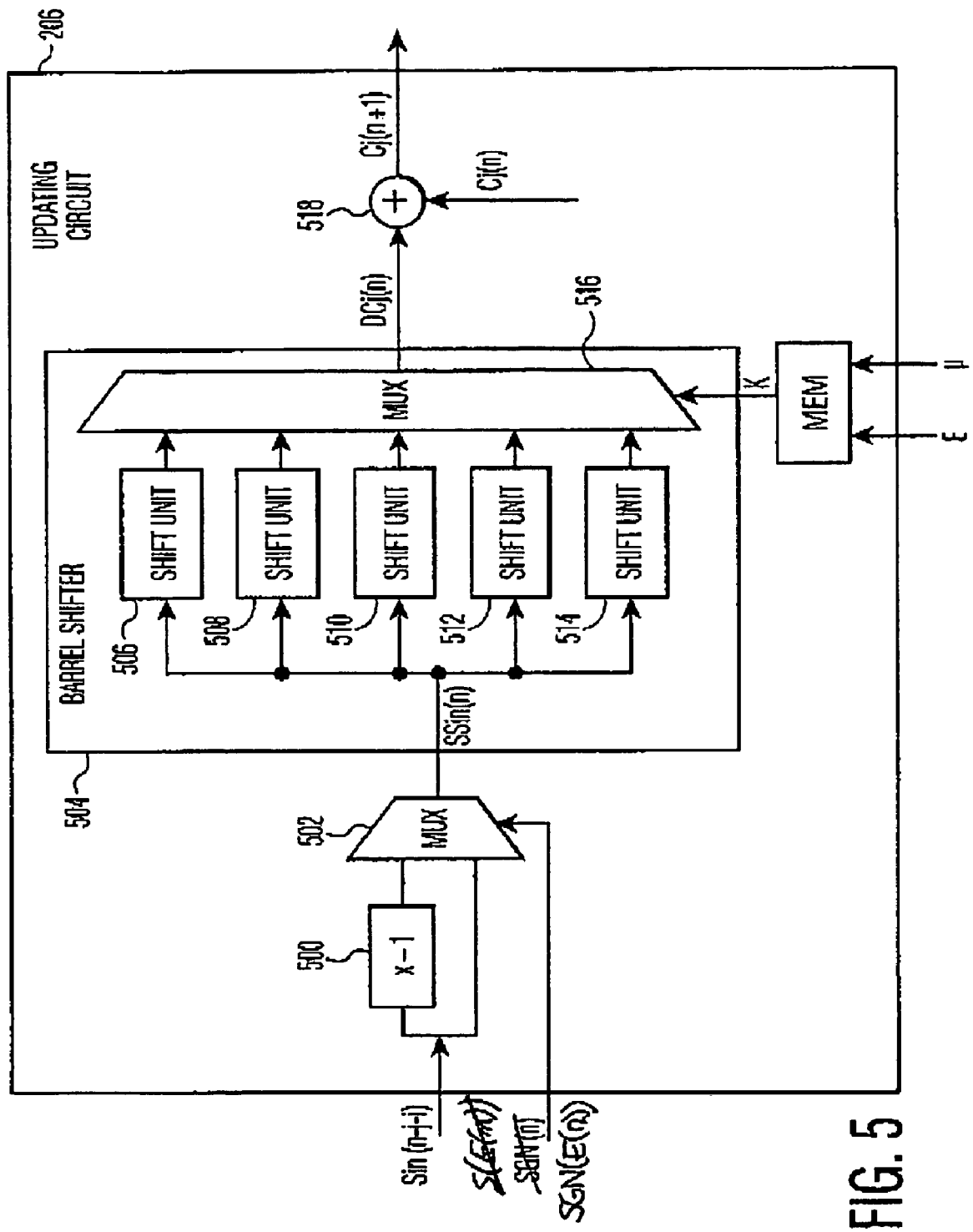
FIG. 5 is an updating circuit in accordance with the invention.

FIG. 5 is a block diagram of an example embodiment of the circuit 206 of the invention. The updating circuit 206 first comprises an inverting unit 500 for deriving a signal having a same magnitude as the signal Sin but of opposite polarity. In this embodiment of the invention, the unit 500 multiplies the input signal by −1. The circuit 206 further comprises a multiplexer 502. At time n, when updating a given coefficient Cj, the multiplexer 502 receives the value Sin(n−j−i) at time n and the output of the unit 500, which is −Sin(n−j−i), where i is the aforementioned processing delay to produce the error signal E(n). The multiplexer 502 also receives the value of the signal SGN(E(n)) at time n. Regarding the value of the signal SGN(E(n)), the multiplexer 502 provides a signed signal SSin having at time n the value Sin(n−j−i) or the negative of the value Sin(n−j−i). SGN(E(n)) is a binary signal corresponding to the polarity of the error signal. When the error signal is positive or null, SGN(E(n)) is zero; otherwise, it is one. When at time n, the value SGN(E(n)) is 0, the value of SSin is Sin(n−j−i). When the value of SGN(E(n)) is 1, the value of SSin is −Sin(n−j−i).

The signal SSin is then provided to a barrel shifter 504 for providing the updating amount DCj(n) as the product of the value SSin(n) and the value of the step gain M. The step gain M at time n is obtained from the magnitude of the error signal at time n. Since the step gain M is of the form $2^{(K1+K2)}$ the product is created by means of the barrel shifter 504. The barrel shifter 504 comprises, for example, five shift units 506, 508, 510, 512 and 514 for performing different right binary shifts of the signal SSin(n) at time n for different values of K1+K2. For example, the shift units 506, 508, 510, 512, 514 may be implemented as bus connectors and perform bit reordering. In this embodiment, the unit 506 allows to right-shift the signal SSin of one position, the unit 508 allows to right-shift the signal SSin of two positions. The barrel shifter 504 also comprises a multiplexer 516 for providing the updating amount DCj(n) as the output of one of the shift units 506, 508, 510, 512, 514 depending on the provided value of K=K1+K2. In this embodiment of the invention, the updating circuit comprises a look-up table MEM for storing values of the integer K for different combinations of the values of the magnitude of the error signal E and of the step gain parameter µ. In another embodiment of the invention, the look-up table MEM may be implemented outside the circuit 206 and there may be several look-up tables MEM. For example, different look-up tables may correspond to different values of the step gain parameter µ, various channel conditions for the transmission of the input signal Sin, trained or blind mode of the coefficients updating, error rate, etc. . . . Thus, regarding to the value of K, the barrel shifter 504 provides the correct amount DCj(n) at time n.

The circuit 206 comprises an adder 518 for updating the coefficient Cj with the derived amount DCj(n), thus providing a new value Cj(n+1).

It is to be noted that, with respect to the described method, modifications or improvements may be proposed without departing from the scope of the invention. For instance, it is clear that this processing method may be implemented in several manners, such as by means of wired electronic circuits or, alternatively, by means of a set of instructions stored in a computer-readable medium, said instructions replacing at least a part of said circuits and being executable under the control of a computer or a digital processor in order to carry out the same functions as fulfilled in said replaced circuits.

We claim:

1. A method of processing an input signal received by a receiver from a transmitter that transmitted a transmitted signal, the input signal being a corrupted form of the transmitted signal, the method comprising the acts of:

filtering the input signal to create an output signal using a filter having adjustable filter coefficients;

deriving an error signal from the output signal;

deriving, for at least a specific one of the filter coefficients, an updating amount from a product of:
a first term that is based on the input signal,
a second term that is based on a polarity of the error signal, and
a step gain of form $2^K$, being of the form K1+K2 with K1 being a negative integer and K2 being a positive integer and K being adjusted based on a magnitude of the error signal and on a step gain parameter;

storing values of K2 for different values of the magnitude of the error signal;

adjusting the specific filter coefficients using the updating amount; and outputting the output signal that better approximates the transmitted signal for further processing by the receiver.

2. The device of claim 1, wherein the step of deriving the error signal comprises comparing the output signal with a reference signal.

3. The device of claim 1, wherein the step of deriving the error signal comprises deriving the error signal based on statistical properties of the output signal without use of a reference signal.

4. A data processing device for processing an input signal which is a corrupted form of an original signal, comprising:

a filtering circuit having adjustable filter coefficients for filtering the input signal and creating an output signal;

an error calculator that is configured to provide an error signal from the output signal;

a step gain calculator that is configured to provide a step gain of a form $2^K$, K being of the form K1+K2 with K1 being a negative integer and K2 being a positive integer and K being adjusted based on a magnitude of the error signal and on a step gain parameter;

a memory circuit for storing values of K2 for different values of the magnitude of the error signal;

a sign unit that is configured to provide a polarity of the error signal;

an updating circuit that is configured to:
provide, for at least a specific one of the filter coefficients, an updating amount from a product of:
a first term that is based on the input signal,
a second term that is based on a polarity of the error signal, and
the step gain, and
adjust the specific one of the filter coefficients using the updating amount; and
output the output signal that better approximates the original signal for further processing.

5. The device of claim 4, wherein the updating circuit includes a barrel shifter that facilitates forming the product.

6. The device of claim 4, wherein K is of a form K1+K2 with K1 and K2 being integers and the device includes a memory circuit for storing values of K2 for different values of the step gain parameter.

7. The device of claim 4, wherein the updating amount is obtained at discrete time n from the error signal at time n-m and the input signal at time n-m, wherein m is representative of a processing delay.

8. The device of claim 4, wherein the filter comprises a digital filter having adaptive coefficients.

9. The device of claim 4, wherein the input signal is digitized.

10. A storage medium comprising a software module for storing a set of instructions executable under control of a processor and provided for performing a method of processing a digital input signal which is a corrupted form of an original signal, the method comprising:

filtering the input signal to create an output signal using a filter having adjustable filter coefficients;

deriving an error signal from the output signal;

deriving, for at least a specific one of the filter coefficients, an updating amount from a product of:
a first term that is based on the input signal,
a second term that is based on a polarity of the error signal, and
a step gain of form $2^K$, K being of the form K1+K2 with K1 being a negative integer and K2 being a positive integer and K being adjusted based on a magnitude of the error term and on a step gain parameter;

storing values of K2 for different values of the magnitude of the error signal;

adjusting the specific one of the filter coefficients using the updating amount; and outputting the output signal that better approximates the original signal for further processing.

* * * * *